US006937946B1

(12) United States Patent
Culp et al.

(10) Patent No.: US 6,937,946 B1
(45) Date of Patent: Aug. 30, 2005

(54) SYSTEM AND METHOD FOR REMOTE IDENTIFICATION OF ENERGY CONSUMPTION SYSTEMS AND COMPONENTS

(75) Inventors: Charles H. Culp, College Station, TX (US); David E. Claridge, College Station, TX (US); Jeffrey S. Haberl, College Station, TX (US); William D. Turner, College Station, TX (US)

(73) Assignee: The Texas A&M University System, College Station, TX (US)

( * ) Notice: Subject to any disclaimer, the term of this patent is extended or adjusted under 35 U.S.C. 154(b) by 321 days.

(21) Appl. No.: 10/004,549

(22) Filed: Dec. 4, 2001

(51) Int. Cl.[7] .................. G01R 21/00; G01R 11/56
(52) U.S. Cl. .................. 702/62; 700/291; 705/412
(58) Field of Search .................. 700/291; 705/400, 705/412; 702/61, 62, 182

(56) References Cited

U.S. PATENT DOCUMENTS

| | | | |
|---|---|---|---|
| 5,115,967 A | | 5/1992 | Wedekind .................. 236/46 R |
| 5,216,623 A | * | 6/1993 | Barrett et al. .................. 702/62 |
| 5,566,084 A | * | 10/1996 | Cmar .................. 700/276 |
| 5,651,264 A | | 7/1997 | Lo et al. .................. 62/230 |
| 5,852,560 A | | 12/1998 | Takeyama et al. ..... 364/468.03 |
| 6,014,716 A | | 1/2000 | Ohara .................. 710/14 |
| 6,088,688 A | * | 7/2000 | Crooks et al. .............. 705/412 |
| 6,178,362 B1 | * | 1/2001 | Woolard et al. ............ 700/295 |
| 6,216,956 B1 | | 4/2001 | Ehlers et al. .................. 236/47 |
| 6,366,889 B1 | * | 4/2002 | Zaloom .................. 705/7 |
| 6,439,469 B1 | | 8/2002 | Gruber et al. .............. 237/8 R |
| 6,577,962 B1 | * | 6/2003 | Afshari .................. 702/61 |
| 6,785,592 B1 | | 8/2004 | Smith et al. ................. 700/291 |
| 2003/0061091 A1 | | 3/2003 | Amaratunga et al. ......... 705/10 |

OTHER PUBLICATIONS

"Data Mining to Improved Energy Efficiency in Buildings", <http://www.knowledgeprocesssoftware.com/newweb/CounterDet>, (28 pages); Sep. 2001.
U.S. Appl. No. 10/004,988, filed Dec. 3, 2001, Culp et al.
U.S. Appl. No. 10/004,985, filed Dec. 3, 2001, Culp et al.
U.S. Appl. No. 10/027,943, filed Dec. 20, 2001, Culp et al.

* cited by examiner

*Primary Examiner*—Marc S. Hoff
*Assistant Examiner*—Paul Kim
(74) *Attorney, Agent, or Firm*—Baker Botts L.L.P.

(57) ABSTRACT

A system for remote energy consumption system identification of a facility includes a processor, and a memory coupled to the processor. The system also includes an energy consumption database accessible by the processor. The energy consumption database includes aggregated energy consumption data associated with the facility. The system also includes a facility database accessible by the processor. The facility database includes facility data associated with the facility. The system further includes an external variable database accessible by the processor. The external variable database includes external variable data corresponding to the energy consumption data. The system also includes an analysis engine residing in the memory and executable by the processor. The analysis engine is operable to generate disaggregated energy consumption data using the aggregated energy consumption data, the facility data, and the external variable data, and identify an energy consumption system of the facility using the disaggregated energy consumption data.

21 Claims, 4 Drawing Sheets

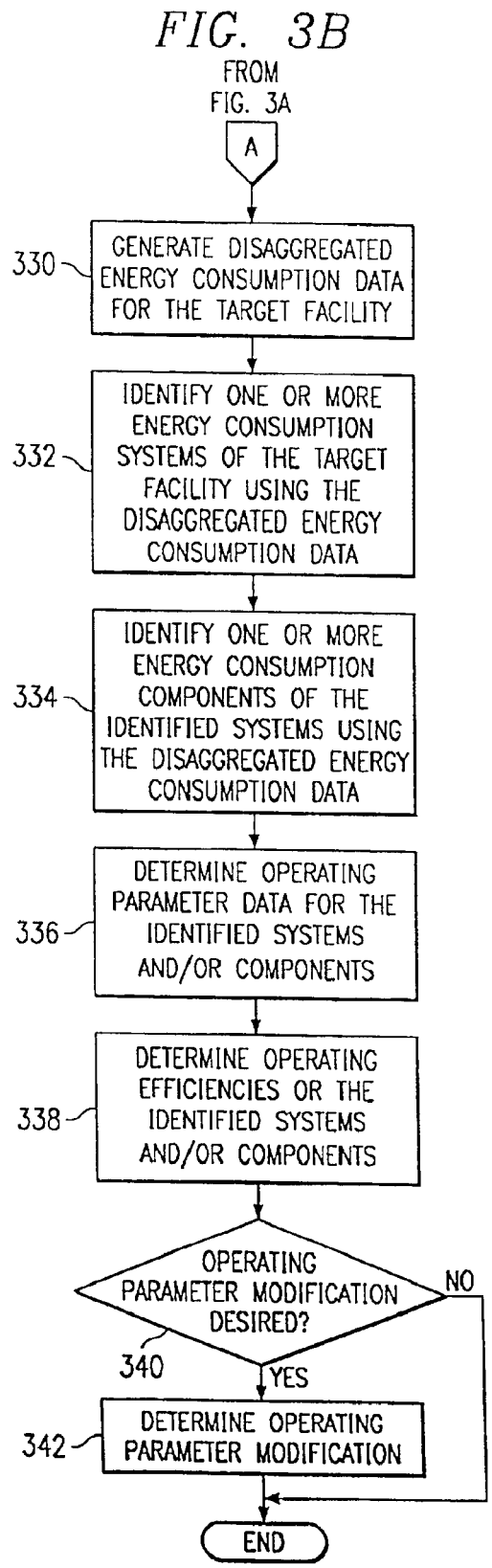

SYSTEM AND METHOD FOR REMOTE IDENTIFICATION OF ENERGY CONSUMPTION SYSTEMS AND COMPONENTS

TECHNICAL FIELD OF THE INVENTION

This invention relates in general to the field of energy systems and, more particularly, to a system and method for remote identification of energy consumption systems and components.

BACKGROUND OF THE INVENTION

Schools, office buildings, homes, department stores, hospitals, and other types of facilities consume energy in varying amounts using a variety of different types of systems and components. For example, energy consumption systems and components may be used for environmental control, such as heating and cooling, for lighting, for security system applications, for computer usage applications, and for a variety of other energy consumption applications corresponding to the particular type of facility.

Because the types of facilities vary to a generally large degree, the energy usage associated with each type of facility also varies to a generally large degree. For example, energy consumption systems and components associated with homes are different than the energy consumption systems and components associated with an office building or hospital, and generally use less energy per unit of conditioned area than the systems and components of the office building or hospital.

Accordingly, because energy usage varies among different types of facilities, different energy consumption systems and components are designed to accommodate the various energy usage requirements of a particular facility. Additionally, in order to evaluate the efficiency of particular energy consumption systems or components, information associated with the facility and the energy consumption systems and/or components must be determined, as well as the amount of energy used by the particular energy consumption systems and/or components. Obtaining the required information, however, generally requires access to the facility and/or the energy consumption systems and components. Accordingly, obtaining the required information is generally expensive and time-consuming.

SUMMARY OF THE INVENTION

Accordingly, a need has arisen for an improved system and method of remotely identifying and analyzing energy consumption systems and components associated with a variety of facilities. The present invention provides a system and method for remote identification of energy consumption systems and components that addresses shortcomings and disadvantages associated with prior energy consumption system and component identification and analysis.

According to one embodiment of the present invention, a method for energy consumption system identification of a facility includes receiving aggregated energy consumption data associated with the facility and receiving external variable data for the facility corresponding to the aggregated energy consumption data. The method also includes generating facility data associated with the facility, and generating disaggregated energy consumption data from the aggregated energy consumption data using the facility data and the external variable data. The method further includes identifying an energy consumption system of the facility using the disaggregated energy consumption data.

According to another embodiment of the present invention, a system for energy consumption system identification of a facility includes a processor, and a memory coupled to the processor. The system includes an energy consumption database accessible by the processor and including aggregated energy consumption data associated with the facility. The system also includes a facility database accessible by the processor including facility data associated with the facility. The system includes an external variable database also accessible by the processor and including external variable data corresponding to the energy consumption data. The system further includes an analysis engine residing in the memory and executable by the processor. The analysis engine is operable to generate disaggregated energy consumption data using the aggregated energy consumption data, the facility data, and the external variable data. The analysis engine is further operable to identify an energy consumption system of the facility using the disaggregated energy consumption data.

The present invention provides several technical advantages. For example, according to one embodiment of the present invention, facility data is generated corresponding to a particular facility, such as the physical characteristics of the facility and/or energy usage characteristics associated with the particular type of facility. External variable data associated with the facility is also retrieved, such as the environmental conditions surrounding the facility during a particular period of time. Aggregated energy consumption data is also generated or retrieved associated with the particular facility for a particular time period. Using the aggregated energy data, the facility data, and the external variable data, identification of energy consumption systems and/or components associated with the facility may be determined remotely from the facility. Therefore, access to the facility and/or the energy consumption systems and components is generally not required, thereby substantially reducing the time and costs associated with system and component identification.

Another technical advantage of the present invention includes identifying operating parameters of energy consumption systems and/or components associated with a particular facility and determining whether modifications to the operating parameters should be performed to increase efficiency. For example, after identifying the energy consumption systems and/or components associated with a particular facility, the facility data, the aggregated and/or disaggregated energy consumption data, and/or the external variable data may be used to determine whether a modification to the operating parameters of a particular energy consumption system and/or component would increase efficiency and/or reduce energy usage and costs. For example, in the case of an office building or department store, the external variable data, the facility data, and the energy usage data may indicate that activation and deactivation of the energy consumption systems and/or components may be modified to predetermined times or intervals to maximize efficiency and reduce associated energy usage costs.

Other technical advantages are readily apparent to those skilled in the art from the following figures, descriptions, and claims.

BRIEF DESCRIPTION OF THE DRAWINGS

For a more complete understanding of the present invention, and the advantages thereof, reference is now made to the following description, taken in conjunction with the accompanying drawings, wherein like reference numerals represent like parts, in which:

FIGS. 3A and 3B are flow charts illustrating a method of remotely identifying energy consumption systems and components in accordance with an embodiment of the present invention.

DETAILED DESCRIPTION OF THE INVENTION

Figure 1:
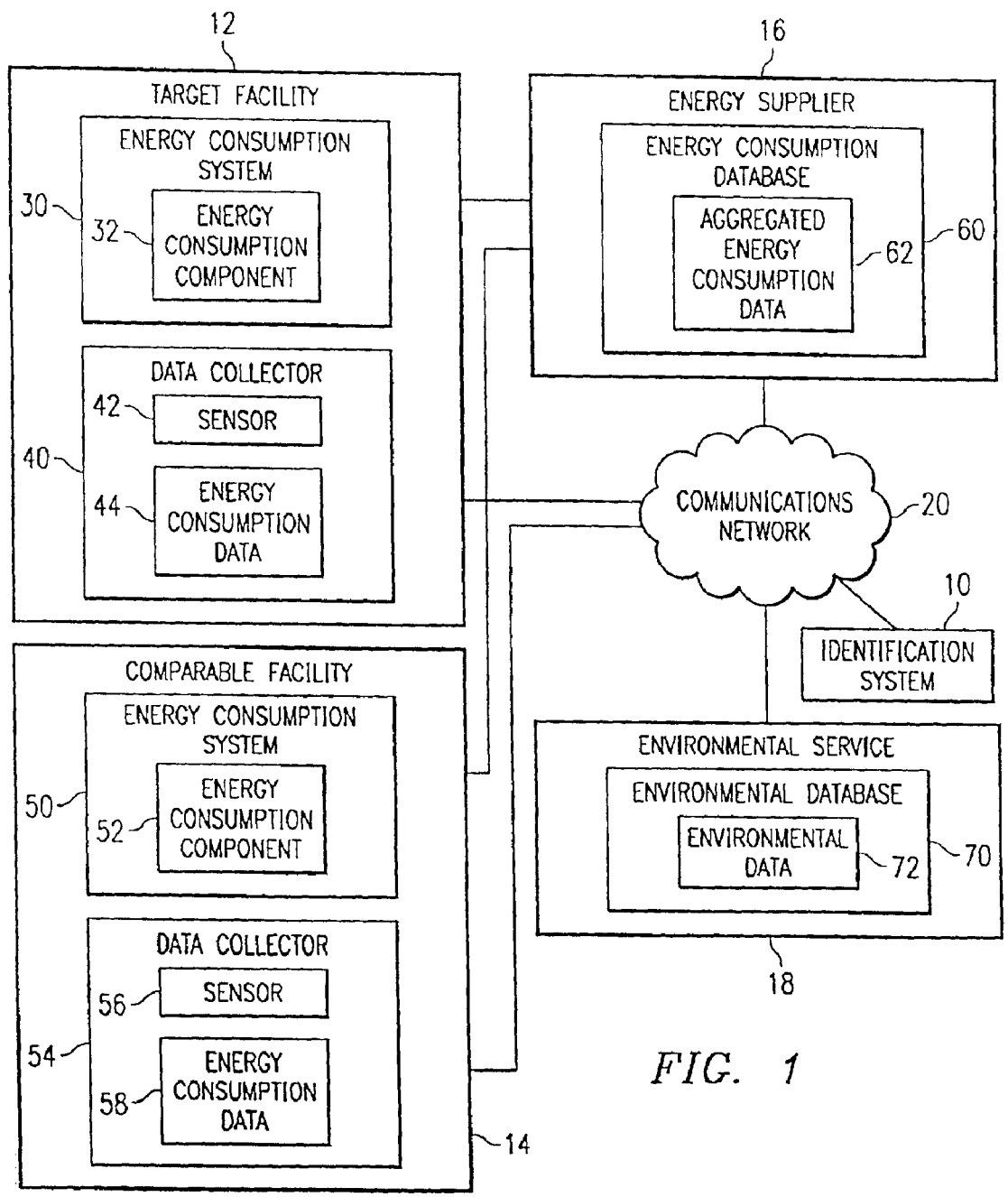
FIG. 1 is a block diagram illustrating a system for remote identification of energy consumption systems and components in accordance with an embodiment of the present invention.

FIG. 1 is a block diagram in which a system 10 for remote identification of energy consumption systems and components in accordance with an embodiment of the present invention is illustrated. In the illustrated embodiment, system 10 is coupled to a target facility 12, a comparable facility 14, an energy supplier 16, and an environmental service 18 via a communications network 20. The communications network 20 may be different networks, or the same network, and may include any Internet, intranet, extranet, or similar communication network. The communications network 20 provides an electronic medium for transmitting and receiving information between the system 10 and facilities 12 and 14, the environmental service 18, and the energy supplier 16. However, other electronic and non-electronic modes of communication may also be used for transmitting and receiving information between the system 10 and the facilities 12 and 14, the environmental service 18, and the energy supplier 16.

The target facility 12 includes one or more energy consumption systems 30 such as, but not limited to, heating and cooling systems, lighting systems, computer systems, medical systems, product manufacturing systems, and/or a variety of other types of energy consumption systems. Accordingly, each energy consumption system 30 may include one or more discrete energy consumption components 32. For example, a heating/cooling energy consumption system 30 may include energy consumption components 32 such as boilers, heat exchangers, fans, compressors, and other related components. Accordingly, depending on the type of energy consumption system 30, the energy consumption components 32 relate to the function and operation of the particular energy consumption system 30.

The target facility 12 may also include one or more data collectors 40 each coupled to or disposed proximate to one or more of the energy consumption systems 30 and/or components 32. Each data collector 40 may also include or be coupled to a sensor 42 for determining energy consumption or usage corresponding to energy consumption systems 30 and the energy consumption components 32. For example, each sensor 42 may be coupled to or disposed proximate to a corresponding energy consumption component 32 and/or system 30 to acquire energy consumption or other information associated with the operation and efficiency of a particular energy consumption system 30 and/or component 32, such as, but not limited to, electrical usage, water flow rates, internal and external temperature data, internal and external humidity values, wind speed and direction, precipitation, and cloud conditions. Each sensor 42 may also include processing, memory, communication, and other functional capabilities for collecting, processing, manipulating, storing, and/or transmitting the acquired information associated with a particular energy consumption component 32 and/or system 30.

Each data collector 40 may also include processing, memory, communication, and other functional capabilities for receiving, manipulating, processing, storing and/or transmitting the energy consumption and other information acquired by the sensors 42. For example, each data collector 40 may receive, process and store energy usage and/or environmental information associated with a particular energy consumption system 30 and/or component 32 as energy consumption data 44. The energy consumption data 44 may then be shared between one or more other data collectors 40, transmitted to a central monitoring station, or otherwise stored, transferred and/or manipulated.

Facility 14 is generally a structure having similar or comparable energy consumption features as the target facility 12. For example, facilities 12 and 14 may both be a hospital, an office building, a department store, or other type of structure having similar energy usage characteristics such that the energy usage characteristics of the facility 14 may be used to determine or approximate the energy usage characteristics for the target facility 12. As described above in connection with the target facility 12, the comparable facility 14 may also include one or more energy consumption systems 50 each comprising one or more energy consumption components 52. Also as described above in connection with the target facility 12, the comparable facility 14 may also include one or more data collectors 54, each data collector 54 comprising or coupled to one or more sensors 56. The data collectors 54 and sensors 56 may also be used to process and store energy usage information associated with the facility 14 as energy consumption data 58.

The energy supplier 16 generally includes a utility company or other provider of energy services to businesses, homes, or other energy users. The energy supplier 16 generally includes an energy consumption database 60 containing aggregated energy consumption data 62 associated with each of the facilities 12 and 14. The aggregated energy consumption data 62 may reflect energy usage as a function of time and expressed in a variety of different formats; however, the aggregated energy consumption data 62 may also include other energy-related information within the scope of the present invention.

The environmental service 18 comprises a weather service, meteorological service, or other service containing weather and/or environmental information, such as, but not limited to, the National Weather Service or other regional or local weather services or stations. The environmental service 18 generally includes an environmental database 70 containing environmental data 72 corresponding to particular periods of time and associated with the vicinity of the facilities 12 and/or 14. The environmental data 72 may include temperature data, humidity measurements, wind speed and direction, precipitation, cloud conditions, and other environmental information that may affect energy usage or consumption during a particular period of time.

Briefly, the identification system 10 retrieves energy consumption information associated with the target facility 12 via the communications network 20 from the energy supplier 16 and/or directly from the target facility 12. The identification system 10 may also retrieve energy consumption information via the communications network 20 associated with the facility 14 from the energy supplier 16 and/or directly from the facility 14. Additionally, the identification system 10 retrieves environmental data 72 via the communications network 20 from the environmental service 18. Using the energy consumption information and the environmental data 72, the identification system 10 is used to remotely identify the energy consumption systems 30 and/or components 32 of the target facility 12 and analyze various operating parameters of the energy consumption systems 30 and/or components 32. The system 10 is described in greater detail below in connection with FIGS. 2, 3A and 3B.

Figure 2:
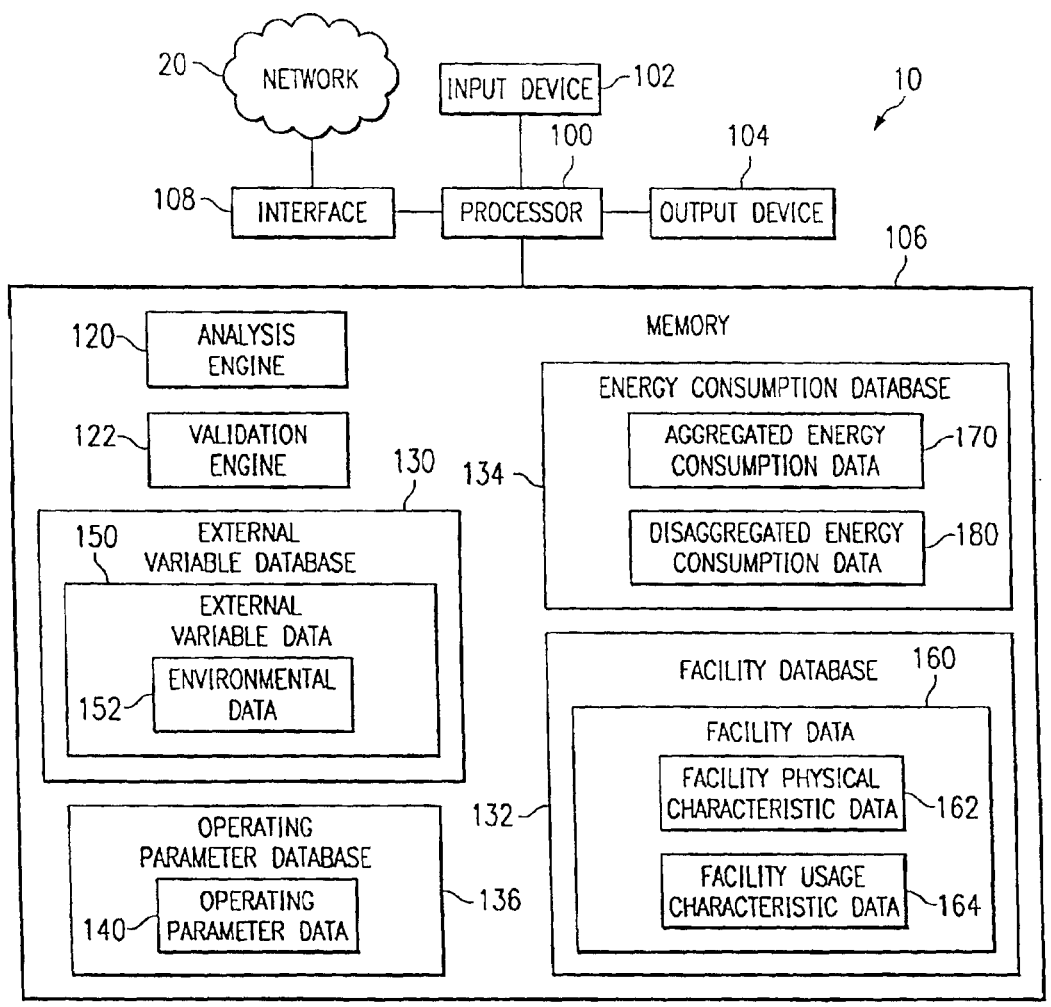
FIG. 2 is another block diagram illustrating the system for remote identification of energy consumption systems and components in accordance with an embodiment of the present invention.

FIG. 2 is a block diagram illustrating the system 10 in accordance with an embodiment of the present invention. In this embodiment, system 10 includes a processor 100, an input device 102, an output device 104, and a memory 106. The present invention also encompasses computer software that may be stored in memory 106 and executed by processor 100. The computer software may also be stored in a variety of other types of storage media including, but not limited to, floppy disk drives, hard drives, CD-ROM disk drives, or magnetic tape drives. Information, such as environmental data, energy usage data, or other types of information, may be received from a user of system 10 using a keyboard or any other type of input device 102. Output values or results may be output to a user of system 10 through output device 104, which may include a display, printer, or any other type of output device. The system 10 may also include an interface 108 for communicating via the communications network 20.

System 10 includes an analysis engine 120 and a validation engine 122, which are computer software programs. In FIG. 2, the analysis engine 120 and validation engine 122 are illustrated as being stored in the memory 106, where they can be executed by the processor 100. However, the analysis engine 120 and validation engine 122 may also be stored on other suitable types of storage media.

System 10 also includes an external variable database 130, a facility database 132, an energy consumption database 134, and an operating parameter database 136. In FIG. 2, the external variable database 130, facility database 132, energy consumption database 134, and operating parameter database 136 are illustrated as being stored in the memory 106, where they can be accessed by the processor 100. However, the databases 130, 132, 134, and 136 may also be stored on other suitable types of storage media.

The external variable database 130 includes external variable data 150 associated with the target facility 12 and/or comparable facility 14. For example, the external variable data 150 may include environmental data 152 associated with the facilities 12 and 14. The environmental data 152 may include information associated with environmental conditions internal and external to the physical location of the facilities 12 and/or 14, such as temperatures, humidity, wind speed and direction, precipitation, cloud conditions, and other environment-related information. The environmental data 152 may be downloaded to the external variable database 130 from the environmental service 18 via the communications network 20. The environmental data 152 may also be retrieved directly from the facilities 12 and/or 14 via the communications network 20. For example, as described above, the energy consumption data 44 and 58 associated with each of the respective facilities 12 and 14 may include information associated with the internal and external environmental conditions proximate to and affecting the operating parameters of the energy consumption systems 30 and 50 and/or components 32 and 52. It should be understood, however, that the environmental data 152 may be otherwise obtained and/or stored within the scope of the present invention.

The facility database 132 includes facility data 160 associated with the target facility 12 and/or comparable facility 14. For example, the facility data 160 may include facility physical characteristic data 162 and facility usage characteristic data 164. The facility physical characteristic data 162 may include information corresponding to the physical features of target facility 12 or comparable facility 14, such as, but not limited to, the quantity of floors or levels, the square footage of each floor or level, whether the facility adjoins another structure, the architectural aspects of the facility, and the type of materials used in the construction of the facility.

The facility usage characteristic data 164 may include information associated with energy usage patterns and characteristics corresponding to the type of target facility 12. For example, the data 164 may include information such as, but not limited to, whether the facility is a hospital, office building, department store, grocery store, home, or other type of facility, and the energy usage cycles and patterns associated with the type of facility, such as, but not limited to, periods of minimal or peak energy usage, the types of energy consumption systems and components generally used in corresponding types of facilities, whether one or more floors or levels of the facility incur greater energy usage than other levels or floors due to the energy usage applications generally found on the particular levels or floors, or other information associated with energy usage characteristics unique to the target facility 12 and/or comparable facility 14. For example, a hospital may experience a generally consistent energy usage pattern while an office building or department store may experience more cyclic energy usage patterns. Additionally, for example, in an office building application, one or more floors, or a portion of one or more floors, may be dedicated to computer server or network applications for providing computer services to various locations within the building. Accordingly, the floors or portions of floors containing the computer server and network applications may experience greater energy consumption than other floors of the building.

The energy consumption database 134 includes aggregated energy consumption data 170 associated with the target facility 12 and/or comparable facility 14. The aggregated energy consumption data 170 may be downloaded via the communications network 20 from the energy supplier 16, the target facility 12, and/or the comparable facility 14. For example, the aggregated energy consumption data 62, the energy consumption data 44, and/or the energy consumption data 58 may be retrieved via the communications network 20 and stored in the energy consumption database 134 as the aggregated energy consumption data 170. However, the aggregated energy consumption data 170 may be otherwise received and stored within the scope of the present invention.

In operation, the system 10 retrieves and stores the aggregated energy consumption data 170 from the energy supplier 16, the target facility 12, and/or the comparable facility 14. As described above, the aggregated energy consumption data 170 may be retrieved via the communications network 20 or other suitable electronic or non-electronic communication modes. The system 10 also retrieves and stores the external variable data 150 and the facility data 160 in a similar manner and as described above. The analysis engine 120 may also be used to generate the facility data 160 using the aggregated energy consumption data 170. For example, the aggregated energy consumption data 170 may exhibit energy usage patterns generally associated with particular types of facilities and generally associated with particular sizes of facilities. Thus, the physical characteristic data 162 and usage characteristic data 164 may be derived from the aggregated energy consumption data 170.

The validation engine 122 is used to validate the aggregated energy consumption data 170 and ensure that the aggregated energy consumption data 170 is complete and, therefore, not missing energy consumption information. For example, the aggregated energy consumption data 170 may include energy consumption information corresponding to specific time intervals or periods. The validation engine 122 determines whether energy consumption information is missing from the aggregated energy consumption data 170 and reconstructs the missing energy consumption information. For example, energy consumption data 58 from the comparable facility 14 may be retrieved and energy consumption information associated with particular time periods or intervals may be reconstructed from the energy consumption data 58 alone or in combination with the environmental data 152.

The analysis engine 120 is used to generate and store disaggregated energy consumption data 180 associated with the target facility 12 using the facility data 160, the aggregated energy consumption data 170, and the external variable data 150. For example, the aggregated energy consumption data 170 for particular periods or intervals of time and the environmental data 152 may be used to disaggregate the energy consumption information associated with the entire target facility 12 where the energy consumption associated with the energy consumption components 32 may be additively combined. The analysis engine 120 may utilize heuristic and/or semi-empirical calculations to analyze the energy consumption of the energy consumption components 32 and to provide a mechanism for generating the disaggregated energy consumption data 180 from the aggregated energy consumption data 170. The analysis engine 120 may also use 1 parameter, 2 parameter, 3 parameter, 4 parameter, 5 parameter, change point multiple linear regression, or bin analysis techniques and calculations to analyze the energy consumption associated with the energy consumption components 32 to provide a mechanism for generating the disaggregated energy consumption data 180 from the aggregated energy consumption data 170. A weather-daytyping method for generating the disaggregated energy consumption data 180 may also be used by the analysis engine 120. For example, facilities using controlled sequencing of energy loads may be used to identify energy consumption levels of individual energy loads on consumption of the entire target facility 12, combined with a 24-hour profile for generating the disaggregated energy consumption data 180. However, other suitable methods may also be used to generate the disaggregated energy consumption data 180.

From the disaggregated energy consumption data 180, the analysis engine 120 is used again to determine the energy consumption components 32 and/or systems 30 of the target facility 12. For example, one or more of the environmental data 152, the facility physical characteristic data 162, and the facility usage characteristic data 164 may be used in combination with the disaggregated energy consumption data 180 to identify precisely or approximately the energy consumption systems 30 and/or components 32 used by and within the target facility 12. Thus, the system 10 may be used to remotely identify the systems 30 and/or components 32 of the target facility 12, thereby substantially reducing or eliminating costly and time-consuming site visits and information gathering operations.

The analysis engine 120 may also be used to generate and store operating parameter data 140 in the operating parameter database 136. The operating parameter data 140 includes information associated with the operating parameters of the energy consumption systems 30 and/or components 32 of the target facility 12 based on the disaggregated energy consumption data 180. Additionally, the analysis engine 120 may be used to determine the operating efficiency of the systems 30 and/or components 32 of the target facility 12 using the operating parameter data 140. For example, using the environmental data 152, the Facility data 160, and/or the disaggregated energy consumption data 180, the analysis engine 120 may remotely determine the operating efficiency of the systems 30 and/or components 32.

Figure 3A:
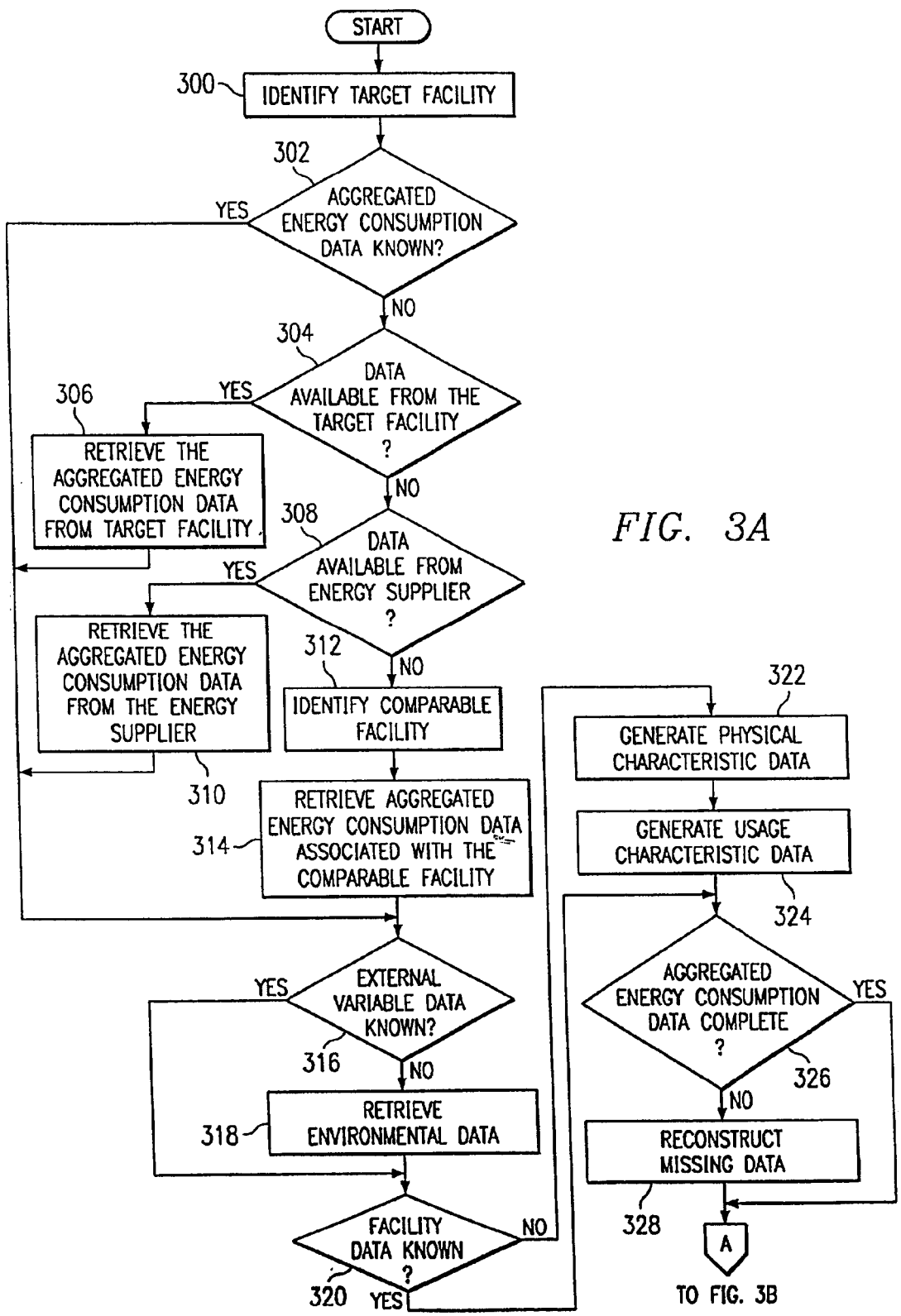

FIGS. 3A and 3B are flowcharts illustrating a method for remote identification of energy consumption systems 30 and/or components 32 in accordance with an embodiment of the present invention. The method begins at step 300, where a target facility 12 is identified. At decisional step 302, a determination is made whether aggregated energy consumption data 170 for the target facility 12 is known. If the aggregated energy consumption data 170 for the target facility 12 is known, the method proceeds from step 302 to step 316. If the aggregated energy consumption data 170 for the target facility 12 is unknown, the method proceeds from step 302 to decisional step 304, where a determination is made whether the aggregated energy consumption data 170 is available directly from the target facility 12. If the aggregated energy consumption data 170 is available directly from the target facility 12, the method proceeds from step 304 to step 306, where the energy consumption data 44 may be retrieved from the data collector 40 of the target facility 12 via the communications network 20 and stored as the aggregated energy consumption data 170 in the energy consumption database 134.

If the aggregated energy consumption data 170 is not available directly from the target facility 12, the method proceeds from step 304 to decisional step 308, where a determination is made whether the aggregated energy consumption data 170 is available from the energy supplier 16. If the aggregated energy consumption data 170 is available from the energy supplier 16, the method proceeds from step 308 to step 310, where the aggregated energy consumption data 62 associated with the target facility 12 is retrieved via the communications network 20 and stored as the aggregated energy consumption data 170 in the energy consumption database 134.

If the aggregated energy consumption data 170 associated with the target facility 12 is not available from the energy supplier 16, the method proceeds from step 308 to step 312, where a comparable facility 14 is identified. At step 314, aggregated energy consumption data 170 associated with the comparable facility 14 is retrieved. For example, as described above in connection with the target facility 12, the energy consumption data 58 may be retrieved directly from the comparable facility 14 via the communications network 20, or the aggregated energy consumption data 62 associated with the comparable facility 14 may be retrieved from the energy supplier 16 via the communications network 20. However, as described above, aggregated energy consumption data 170 associated with the comparable facility 14 may be otherwise retrieved and stored as the aggregated energy consumption data 170.

At decisional step 316, a determination is made whether the external variable data 150 associated with either the target facility 12 or the comparable facility 14 is known. If the external variable data 150 is known, the method proceeds from step 316 to step 320. If the external variable data 150 is unknown, the method proceeds from step 316 to step 318, where the environmental data 152 is retrieved from the environmental service 18 via the communications network 20 corresponding to the facilities 12 and/or 14. For example, the environmental data 72 may be retrieved via the communications network 20 and stored as the environmental data 152 within the external variable database 130. Additionally, as described above, the energy consumption data 44 and 58 may also contain information associated with the internal and external environmental conditions of the respective facilities 12 and 14. Thus, the environmental information contained within the data 44 and 58 may be extracted and stored as the environmental data 152. However, as described above, the environmental data 152 may be otherwise retrieved and stored within the scope of the present invention.

At decisional step 320, a determination is made whether the facility data 160 associated with the target facility 12 is known. If the facility data 160 is known, the method proceeds from step 320 to step 326. If the facility data 160 associated with the target facility 12 is unknown, the method proceeds from step 320 to step 322, where the facility physical characteristic data 162 is generated for the target facility 12. For example, facility physical characteristic data 162 associated with the target facility 12 may be stored within the facility database 132, such as the size of the target facility 12, the quantity of floors or levels of the target facility 12, and other information associated with the physical characteristics of the target facility 12. At step 324, the facility usage characteristic data 164 associated with the target facility 12 is generated and stored within the facility database 132. For example, the facility usage characteristic data 164 may include information such as whether the target facility 12 is a hospital, business, home, or other type of facility generally indicating energy consumption patterns associated with a particular type of target facility 12.

At decisional step 326, a determination is made whether the aggregated energy consumption data 170 is complete. For example, the aggregated energy consumption data 170 may be incomplete such that energy consumption information is missing or is unavailable for various time periods or intervals. If the aggregated energy consumption data 170 is complete, the method proceeds from step 326 to step 330. If the aggregated energy consumption data 170 is incomplete, the method proceeds from step 326 to step 328, where the validation engine 122 is used to reconstruct the missing data. For example, as described above, the missing energy consumption information may be reconstructed using energy consumption data 58 associated with a comparable facility 14 in combination with the environmental data 152. Alternatively, the validation engine 122 may also use the aggregated energy consumption data 170 associated with the target facility 12 corresponding to other similar environmental conditions for other predetermined time periods or intervals to generate the missing energy consumption data. Other suitable methods and/or techniques alone or in combination may be utilized to reconstruct the missing data. Some examples are as follows: statistical analysis, such as linear and nonlinear interpolation, calculation methods, such as autoregressive integrated moving average and multiple autoregressive integrated moving average, pattern recognition techniques, and expert systems, such as neural network (s), fuzzy logic and first principles analysis.

At step 330, disaggregated energy consumption data 180 is generated for the target facility 12 using the aggregated energy consumption data 170, the external variable data 150, and the facility data 160. At step 332, one or more energy consumption systems 30 are identified for the target facility 12 using the disaggregated energy consumption data 180. At step 334, one or more energy consumption components 32 are identified for each corresponding energy consumption system 30 using the disaggregated energy consumption data 180.

At step 336, operating parameter data 140 is generated for each of the energy consumption systems 30 and/or energy consumption components 32 associated with the target facility 12. For example, portions of the disaggregated energy consumption data 180 may be identified with particular energy consumption systems 30 and/or energy consumption components 32 such that the operating parameters associated with the energy consumption systems 30 and/or components 32 are known. At step 338, the operating efficiencies of the energy consumption systems 30 and/or components 32 are determined. At decisional step 340, a determination is made whether modifications to the operating parameters of the energy consumption systems 30 and/or components 32 is required to increase the operating efficiency. If a modification to an operating parameter is desired, the method proceeds from step 340 to step 342, where the analysis engine 120 may be used to determine the modification to the corresponding operating parameter to increase operating efficiency. If no modification to an operating parameter is desired, the method ends.

Thus, the present invention provides a system 10 for remotely identifying and analyzing the energy consumption systems 30 and/or components 32 of the facility 12 absent costly and time-consuming site visits to the facility 12. Additionally, the operating parameters and efficiencies of the various systems 30 and components 32 of the facility 12 may be determined and analyzed remotely to identify operating efficiency improvements for the facility 12.

Although the present invention is described in detail, various changes and modifications may be suggested to one skilled in the art. The present invention encompasses such changes and modifications as falling within the scope of the appended claims.

What is claimed is:

1. A method for remote energy consumption system identification of a facility, comprising:
   receiving aggregated energy consumption data associated with the facility;
   receiving external variable data for the facility corresponding to the aggregated energy consumption data;
   generating facility data associated with the facility;
   remotely generating disaggregated energy consumption data for the facility from the aggregated energy consumption data using the facility data and the external variable data;
   remotely identifying an energy consumption component of the facility using the disaggregated energy consumption data;
   validating the aggregated energy consumption data;
   analyzing the aggregated energy consumption data for missing data; and
   reconstructing the missing data.

2. The method of claim 1, wherein reconstructing the missing data comprises:
   identifying a comparable facility;
   retrieving energy consumption data associated with the comparable facility; and
   reconstructing the missing data using the comparable facility energy consumption data.

3. The method of claim 1, wherein receiving the aggregated energy consumption data comprises receiving the aggregated energy consumption data from an energy consumption database of an energy supplier.

4. The method of claim 1, wherein receiving the aggregated energy consumption data comprises remotely receiving, by a communications network, the aggregated energy consumption data from a data collector disposed at the facility.

5. The method of claim 1, wherein remotely identifying an energy consumption component comprises identifying an energy consumption component for controlling an internal environment of the facility.

6. The method of claim 1, wherein generating the facility data comprises generating the facility data based on the aggregated energy consumption data.

7. The method of claim 1, wherein generating the facility data comprises generating the facility data based on physical characteristics of the facility.

8. The method of claim 1, wherein receiving external variable data comprises receiving environmental data corresponding to the aggregated energy consumption data.

9. The method of claim 8, wherein receiving the environmental data comprises receiving the environmental data from an environmental service.

10. The method of claim 1, further comprising determining a modification of operating parameters of the energy consumption system using the disaggregated energy consumption data.

11. The method of claim 1, wherein remotely generating disaggregated energy consumption data comprises remotely determining energy consumption for a particular time interval from the aggregated energy consumption data, and wherein remotely identifying an energy consumption component comprises remotely identifying the energy consumption component from the energy consumption for the particular time interval.

12. The method of claim 1, wherein remotely generating disaggregated energy consumption data comprises:

accessing an energy consumption database of an energy supplier, the energy consumption database having energy consumption data associated with facility; and evaluating the energy consumption data of the energy supplier energy consumption database and the facility data to generate the disaggregated energy consumption data corresponding to the facility.

13. A system for remote energy consumption system identification of a facility, comprising:

a processor;

a memory coupled to the processor;

an energy consumption database accessible by the processor, the energy consumption database having aggregated energy consumption data associated with the facility;

a facility database accessible by the processor, the facility database having facility data associated with the facility;

an external variable database accessible by the processor, the external variable database having external variable data corresponding to the energy consumption data;

an analysis engine residing in the memory and executable by the processor, the analysis engine operable to generate disaggregated energy consumption data using the aggregated energy consumption data, the facility data, and the external variable data, the analysis engine further operable to remotely identify an energy consumption component of the facility using the disaggregated energy consumption data; and a validation engine residing in the memory and executable by the processor, the validation engine operable to validate the aggregated energy consumption data, wherein the validation engine is further operable to analyze the aggregated energy consumption data for missing data and, in response to determining that missing data exists, reconstruct the missing data.

14. The system of claim 13, wherein the processor is further operable to access energy consumption data associated with a comparable facility, and wherein the validation engine is operable to reconstruct the missing data using the comparable facility energy consumption data.

15. The system of claim 13, wherein the aggregated energy consumption data comprises aggregated energy consumption data residing in an energy consumption database of an energy supplier.

16. The system of claim 13, further comprising a data collector disposed at the facility, the data collector operable to transmit the aggregated energy consumption data to the processor by a communications network.

17. The system of claim 13, wherein the facility data is generated based on the aggregated energy consumption data.

18. The system of claim 13, wherein the facility data comprises facility data based on physical characteristics of the facility.

19. The system of claim 13, wherein the external variable data comprises environmental data corresponding to the aggregated energy consumption data.

20. The system of claim 13, wherein the analysis engine is further operable to determine operating parameters of the energy consumption component using the disaggregated energy consumption data.

21. The system of claim 20, wherein the analysis engine is further operable to determine a modification to the operating parameters of the energy consumption component from the disaggregated energy consumption data.

* * * * *